(12) United States Patent
Sakurada et al.

(10) Patent No.: US 7,745,720 B2
(45) Date of Patent: Jun. 29, 2010

(54) THERMOELECTRIC MATERIAL AND THERMOELECTRIC DEVICE

(75) Inventors: Shinya Sakurada, Tokyo (JP); Naoki Shutoh, Yokohama (JP); Shinsuke Hirono, Yokohama (JP)

(73) Assignees: Kabushiki Kaisha Toshiba, Tokyo (JP); Toshiba Materials Co., Ltd., Kanagawa (JP)

( * ) Notice: Subject to any disclaimer, the term of this patent is extended or adjusted under 35 U.S.C. 154(b) by 854 days.

(21) Appl. No.: 11/088,245

(22) Filed: Mar. 24, 2005

(65) Prior Publication Data

US 2005/0217715 A1  Oct. 6, 2005

(30) Foreign Application Priority Data

Mar. 30, 2004 (JP) ............... 2004-100813

(51) Int. Cl.
*H01L 35/12* (2006.01)
*H01L 35/30* (2006.01)
*H01L 35/14* (2006.01)
*H01L 35/20* (2006.01)
*H01B 1/02* (2006.01)

(52) U.S. Cl. ............. 136/236.1; 136/238; 136/239; 136/240; 136/203; 136/205; 252/519.12

(58) Field of Classification Search ........... 136/236.1, 136/238, 239, 240
See application file for complete search history.

(56) References Cited

U.S. PATENT DOCUMENTS 5,929,351 A * 7/1999 Kusakabe et al. ............. 75/228
2003/0084935 A1 * 5/2003 Bell ............................ 136/200
2004/0112418 A1 * 6/2004 Yang et al. .................. 136/239
2004/0261833 A1 * 12/2004 Ono et al. ................. 136/236.1
2005/0139251 A1 * 6/2005 Shutoh et al. ............... 136/239
2005/0172994 A1 * 8/2005 Shutoh et al. ............... 136/239

FOREIGN PATENT DOCUMENTS

JP    2004-356607    12/2004

OTHER PUBLICATIONS

Hohl et al., "Efficient dopants for ZrNiSn-based thermoelectric materials", vol. 11, No. 7, 1999, pp. 1697-1709(13).*
Poon et al. "Bandgap Features and Thermoelectric Properties of Ti-Based Half-Heusler Alloys" IEEE, 18th International Conference on Thermoelectrics, 1999, pp. 45-51.*

(Continued)

*Primary Examiner*—Alexa D Neckel
*Assistant Examiner*—Golam Mowla
(74) *Attorney, Agent, or Firm*—Nixon & Vanderhye P.C.

(57) ABSTRACT

A thermoelectric material includes a composition represented by the following formula (A):

$$(Ti_{a1}Zr_{b1}Hf_{c1})_x Ni_y Sn_{100-x-y} \quad (A)$$

where $0<a1<1$, $0<b1<1$, $0<c1<1$, $a1+b1+c1=1$, $30 \leq x \leq 35$, and $30 \leq y \leq 35$. The composition includes at least two MgAgAs crystal phases different in a lattice constant, and, assuming that X-ray diffraction peak intensity from a (422) diffraction plane of a first MgAgAs crystal phase having a smallest lattice constant and X-ray diffraction peak intensity from a (422) diffraction plane of a second MgAgAs crystal phase having a largest lattice constant be $I_1$ and $I_2$, respectively, a value of $I_1/(I_1+I_2)$ is in a range of 0.2 to 0.8.

20 Claims, 1 Drawing Sheet

OTHER PUBLICATIONS

Sportouch et al, "Thermoelectric Properties of Half-Heusler Phases: $ErNi_{1-x}Sb$, $YNi_{1-x}Cu_xSb$, and $Zr_xHf_yTi_zNiSn$", 18$^{th}$ International Conference on Thermoelectrics, 1999, pp. 344-347.
U.S. Appl. No. 10/958,376, filed Jun. 30, 2005.
U.S. Appl. No. 10/629,624, filed Aug. 11, 2005.
Japanese Office Action and English Translation mailed Nov. 10, 2009.

* cited by examiner

THERMOELECTRIC MATERIAL AND THERMOELECTRIC DEVICE

CROSS-REFERENCE TO RELATED APPLICATIONS

This application is based upon and claims the benefit of priority from prior Japanese Patent Application No. 2004-100813, filed Mar. 30, 2004, the entire contents of which are incorporated herein by reference.

BACKGROUND OF THE INVENTION

1. Field of the Invention

The present invention relates to a thermoelectric material and a thermoelectric device.

2. Description of the Related Art

In recent years, from increasing concerns to global environmental problems, thermoelectric cooling devices making use of the Peltier effect are highly interested as CFC-free coolers. In addition, in order to reduce carbon dioxide emission, thermoelectric generating devices making use of the Seebeck effect that can provide power generators using unused waste heat energy are highly interested.

Conventionally, typical thermoelectric materials used in room temperature include Bi—Te-based single crystal and polycrystal materials for their high efficiency. When a thermoelectric device is fabricated using both of p-type and n-type Bi—Te-based thermoelectric materials, Bi—Te added with Se is generally used as the n-type Bi—Te. On the other hand, typical thermoelectric materials used at temperatures higher than room temperature include Pb—Te-based materials for their high efficiency. Elements such as Se (selenium), Pb (lead) and Te (tellurium) used in the Bi—Te-base or Pb—Te-based thermoelectric devices are toxic and harmful to human bodies and further undesirable to the global environmental problems. Accordingly, harmless thermoelectric materials have been studied in place of the Bi—Te-based and Pb—Te-based thermoelectric materials.

A figure of merit Z of a thermoelectric material is represented by the following equation (1):

$$Z = \alpha^2/(\rho\kappa) \quad (1)$$

where, α denotes a Seebeck coefficient of the thermoelectric material, ρ denotes an electrical resistivity of the thermoelectric material and κ denotes a thermal conductivity of the thermoelectric material. The figure of merit Z has a dimension of an inverse of temperature, and thus the product of Z and an absolute temperature T has a dimensionless value. The ZT value is referred to as a dimensionless figure of merit. A thermoelectric material having a higher ZT value has higher thermoelectric conversion efficiency. As will be seen from the equation (1), the thermoelectric material is required to have higher Seebeck coefficient, lower electrical resistivity and lower thermal conductivity.

As one of thermoelectric materials in which the toxic materials such as described above are not contained or reduced as far as possible, half-Heusler compounds having a MgAgAs crystal phase are known (see, for example, Proc. of 18th International Conference on Thermoelectrics (1999), p. 344). Conventional half-Heusler compounds have not exhibited sufficient ZT values, however, and therefore an improvement in the ZT value is demanded.

BRIEF SUMMARY OF THE INVENTION

A thermoelectric material according to an aspect of the present invention comprising a composition represented by the following formula (A):

$$(Ti_{a1}Zr_{b1}Hf_{c1})_xNi_ySn_{100-x-y} \quad (A)$$

where 0<a1<1, 0<b1<1, 0<c1<1, a1+b1+c1=1, 30≦x≦35, and 30≦y≦35, wherein the composition has at least two MgAgAs crystal phases different in a lattice constant, and, assuming that X-ray diffraction peak intensity from a (422) diffraction plane of a first MgAgAs crystal phase having a smallest lattice constant and X-ray diffraction peak intensity from a (422) diffraction plane of a second MgAgAs crystal phase having a largest lattice constant be $I_1$ and $I_2$, respectively, a value of $I_1/(I_1+I_2)$ being in a range of 0.2 to 0.8.

A thermoelectric material according to another aspect of the present invention comprises a composition represented by the following formula (B):

$$(Ln_d(Ti_{a2}Zr_{b2}Hf_{c2})_{1-d})_xNi_ySn_{100-x-y} \quad (B)$$

where Ln is at least one element selected from the group consisting of Y and rare earth elements, and 0≦a2≦1, 0≦b2≦1, 0≦c2≦1, a2+b2+c2=1, 0<d≦0.3, 30≦x≦35, and 30≦y≦35, wherein the composition has at least two MgAgAs crystal phases different in a lattice constant, and, assuming that X-ray diffraction peak intensity from a (422) diffraction plane of a first MgAgAs crystal phase having a smallest lattice constant and X-ray diffraction peak intensity from a (422) diffraction plane of a second MgAgAs crystal phase having a largest lattice constant be $I_1$ and $I_2$, respectively, a value of $I_1/(I_1+I_2)$ being in a range of 0.2 to 0.8.

A thermoelectric device according to still another aspect of the present invention comprises p-type thermoelectric chips and n-type thermoelectric chips connected alternately in series, and at least the p-type thermoelectric chips or the n-type thermoelectric chips comprising the thermoelectric material represented by the above formula (A) or the formula (B).

DETAILED DESCRIPTION OF THE INVENTION

Figure 1:
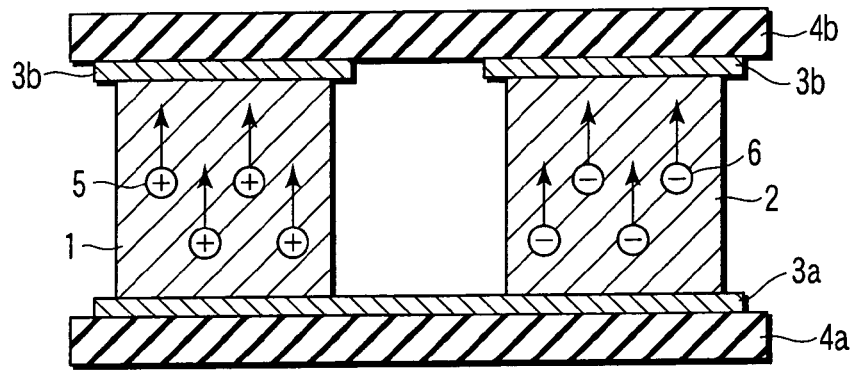
FIG. 1 is a sectional view of a thermoelectric device according to one embodiment of the present invention.

The present inventors have paid attention to the half-Heusler compounds having an MgAgAs crystal phase as thermoelectric materials in which toxic materials are not contained or reduced as far as possible, and have studied these materials with respect to improvement in their performance. As a result, they have found that thermoelectric materials having at least two MgAgAs crystal phases different in a lattice constant exhibit a high ZT value. More specifically, they have found that, assuming that X-ray diffraction peak intensity from a (422) diffraction plane of a first MgAgAs crystal phase having a smallest lattice constant and X-ray diffraction peak intensity from a (422) diffraction plane of a second MgAgAs crystal phase having a largest lattice constant be $I_1$ and $I_2$, respectively, there is a correlation between a value of $I_1/(I_1+I_2)$ and a value of ZT, and that a particularly excellent performance can be given when the $I_1/(I_1+I_2)$ value is in the range of 0.2 to 0.8. A more preferable range of the $I_1/(I_1+I_2)$ value is 0.3 to 0.6.

A method of controlling the $I_1/(I_1+I_2)$ value includes, for example, subjecting the thermoelectric material to heat treatment during manufacturing processes. The $I_1/(I_1+I_2)$ value of a half-Heusler compound that has not experienced heat treatment is normally less than 0.2. On the other hand, appropriate heat treatment can improve the $I_1/(I_1+I_2)$ value to 0.2 or more. The $I_1/(I_1+I_2)$ value is correlated with the treatment temperature. That is, when the temperature is less than 1000° C., the $I_1/(I_1+I_2)$ value will not be made 0.2 or more in many cases. When the temperature is 1000° C. or more and less than 1200° C., the $I_1/(I_1+I_2)$ value can be controlled in the range of 0.2 to 0.8. When the temperature is 1200° C. or more, the $I_1/(I_1+I_2)$ value exceeds 0.8 in many cases. In these cases, it is difficult to obtain excellent thermoelectric characteristics. A more preferable temperature range is 1100° C. or more and less than 1180° C. When the temperature is in the particular range, the $I_1/(I_1+I_2)$ value can be controlled in the range of 0.3 to 0.6. In the case where the $I_1/(I_1+I_2)$ value is in the particular range, the thermoelectric material can exhibit more improved thermoelectric performance.

In the case of molding the thermoelectric material by hot pressing, independent heat treatment can be eliminated because the heating in the hot pressing serves to the heat treatment. In this case, the temperature condition in the hot pressing is important. When the temperature condition in the hot pressing is set to the range of 1000° C. or more and less than 1200° C., the $I_1/(I_1+I_2)$ value can be controlled to the range of 0.2 to 0.8. The more preferable temperature range in the hot pressing is 1100° C. or more and less than 1180° C. When the hot pressing is performed in such a temperature range, the $I_1/(I_1+I_2)$ value can be controlled to the range of 0.3 to 0.6. In the case where the $I_1/(I_1+I_2)$ value is in the particular range, the thermoelectric material can exhibit more improved thermoelectric performance.

Heat treatment of the half-Heusler compound including an MgAgAs crystal phase is described in, for example, J. Phys., Condens. Matter, 11, 1697-1709 (1999); and Phys. Rev., B59, 8615-8621 (1999). The purpose of these documents is to reduce foreign phases other than the MgAgAs crystal phase, however, in which the treatment temperature is set at 900° C. or less. Accordingly, these documents are different from the present invention with respect to the crystal phase.

A thermoelectric material according to an embodiment of the present invention is represented by the following formula (A):

$$(Ti_{a1}Zr_{b1}Hf_{c1})_xNi_ySn_{100-x-y} \quad (A)$$

where $0<a1<1$, $0<b1<1$, $0<c1<1$, $a1+b1+c1=1$, $30 \leq x \leq 35$, and $30 \leq y \leq 35$.

In the case where the thermoelectric material of the formula (A) is expressed as MNiSn and the element M includes all of Ti, Zr and Hf that are homologous elements but different in the atomic weight and the atomic radius, the thermal conductivity of the thermoelectric material can be lowered. The ranges of x and y are preferably set to $30 \leq x \leq 35$ and $30 \leq y \leq 35$, respectively. More preferable ranges of x and y are $33 \leq x \leq 34$ and $33 \leq y \leq 34$. If x and y deviate from the above ranges, a crystal phase other than the MgAgAs crystal phase may be separated, resulting in deteriorated Seebeck coefficient.

A thermoelectric material according to another embodiment of the present invention is represented by the following formula (B):

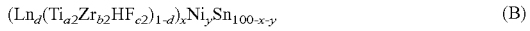

$$(Ln_d(Ti_{a2}Zr_{b2}Hf_{c2})_{1-d})_xNi_ySn_{100-x-y} \quad (B)$$

where Ln is at least one element selected from the group consisting of Y and rare earth elements, and $0 \leq a2 \leq 1$, $0 \leq b2 \leq 1$, $0 \leq c2 \leq 1$, $a2+b2+c2=1$, $0<d \leq 0.3$, $30 \leq x \leq 35$, and $30 \leq y \leq 35$.

The present inventors have found that, if a part of the element M (where M includes Ti, Zr and Hf) in the half-Heusler compound MNiSn of the formula (A) is substituted with at least one element selected from the group consisting of Y and rare earth elements, which has an atomic radius larger than that of any of Ti, Zr and Hf, the thermal conductivity of the thermoelectric material can be improved. Thus, the element Ln selected from Y and rare earth elements is effective for lowering the thermal conductivity of the thermoelectric material. The rare earth elements of Ln include all elements from La at the atomic number 57 to Lu at the atomic number 71 in the periodic table. Taking into consideration to the melting point and the atomic radius, particularly preferable elements for Ln are Er, Gd and Nd.

The element Ln is effective for lowering the thermal conductivity even a slight amount. However, in order to lower the thermal conductivity further, the amount of Ln is preferably 0.1 atomic % or more of the total amount of Ln and M (where M includes Ti, Zr and Hf). In the case where the amount of Ln exceeds 30 atomic % of the total amount of Ln and M (where M includes Ti, Zr and Hf), a crystal phase other than the MgAgAs crystal phase, such as a LnSn$_3$ phase, may be separated remarkably, resulting in deteriorated Seebeck coefficient. Accordingly, the range of d is preferably set to $0<d \leq 0.3$, and more preferably to $0.001 \leq d \leq 0.3$.

In the thermoelectric material represented by the formula (B), all of Ti, Zr and Hf are not necessarily contained as the element M. Thus, ranges of a2, b2 and c2 are defined as $0 \leq a2 \leq 1$, $0 \leq b2 \leq 1$, $0 \leq c2 \leq 1$ and $a2+b2+c2=1$. The ranges of x and y are preferably set to $30 \leq x \leq 35$ and $30 \leq y \leq 35$, respectively. Like the thermoelectric materials represented by the formula (A), if x and y in the formula (B) deviate from the above ranges, a crystal phase other than the MgAgAs crystal phase may be separated, resulting in deteriorated Seebeck coefficient.

It is known that the half-Heusler compounds exhibit a high Seebeck coefficient if the total number of valence electrons is approximately 18. For instance, ZrNiSn has outer shell electron configurations of Zr ($5d^26s^2$), Ni ($3d^84s^2$), and Sn ($5s^25p^2$), so that the total number of valence electrons thereof becomes 18. Similarly, also in each of TiNiSn and HfNiSn, the total number of valence electrons is 18. By contrast, when a part of the element M (where M includes Ti, Zr and Hf) is substituted by a rare earth element as represented by the formula (B), the total number valence electrons in the half-Heusler compounds containing a rare earth element (excluding Ce, Eu and Yb) having the outer shell electron configuration of ($5d^16s^2$) may deviate from 18. Under such conditions, it is preferable to compensate the deviation of the number of valence electrons by properly adjusting x and y.

In the embodiments of the present invention, a part of the element M (where M includes Ti, Zr and Hf) in the above formula (A) or (B) may be substituted by at least one element M' selected from the group consisting of V, Nb, Ta, Cr, Mo and W. The element M' may be used singly or in a combination of two or more species. The substitution of a part of the element M by the element M' makes it possible to adjust the total number of valence electrons in the MgAgAs crystal phase, which may increase the Seebeck coefficient or may lower the electrical resistivity. Furthermore, use of the element M' and the rare earth element, so as to make the total number of the valence electrons close to 18, also may increase the Seebeck coefficient. However, the amount of the element M' is preferably set to 30 atomic % or less of the element M (where M includes Ti, Zr and Hf). If the amount of the element M' exceeds 30 atomic %, a crystal phase other than the MgAgAs crystal phase may be separated, resulting in deteriorated Seebeck coefficient.

In the embodiments of the present invention, a part of Ni in the above formula (A) or (B) may be substituted by at least one element B' selected from the group consisting of Mn, Fe, Co and Cu. The element B' may be used singly or in a combination of two or more species. The substitution of a part of Ni by the element B' makes it possible to adjust the total number of valence electrons in the MgAgAs crystal phase, which may increase the Seebeck coefficient or may lower the electrical resistivity. Generally, the amount of the element B' is preferably set to 50 atomic % or less of Ni. When a part of Ni is substituted by Cu excessively, the MgAgAs crystal phase may be prevented from generating. Therefore, the amount of Cu is preferably set to 30 atomic % or less of Ni.

In the embodiments of the present invention, a part of Sn in the above formula (A) or (B) may be substituted by at least one element X' selected from the group consisting of Si, Mg, As, Sb, Bi, Ge, Pb, Ga and In. The element X' may be used singly or in a combination of two or more species. The substitution of a part of Sn by the element X' makes it possible to adjust the total number of valence electrons in the MgAgAs crystal phase, which may increase the Seebeck coefficient or may lower the electrical resistivity. It is particularly preferable to select the element X' from the group consisting of Si, Sb and Bi, in view of harmlessness, low toxicity and material cost. The amount of the element X' is preferably set to 30 atomic % or less of Sn. When the amount of the element X' exceeds 30 atomic %, a crystal phase other than the MgAgAs crystal phase may be separated, resulting in deteriorated Seebeck coefficient.

The thermoelectric materials according to the embodiments of the present invention can be prepared by such a method as described below.

Firstly, an alloy containing given amounts of respective is prepared by arc melting or high-frequency melting. In preparing the alloy, melt quenching methods such as a single-roller method, a double-roller method, a rotary disc method or a gas atomizing method, or a method using solid-phase reaction such as a mechanical alloying method can be adopted as well. The melt quenching method and the mechanical alloying method are advantageous in that these methods can make a crystal phase of the alloy fine and can make the solid solubility range of an element in the crystal phase wide, which contribute to lower the thermal conductivity.

On the other hand, the alloy can be prepared by hot pressing raw metal powders, without undergoing a melting process.

Next, the prepared alloy is subjected to heat treatment. It should be noted that, when the alloy is prepared by hot-pressing, heating during the hot-pressing serves as the heat treatment. The heat treatment makes it possible to diminish crystal phases other than the MgAgAs crystal phase and to control the grain size. The heat treatment also makes it possible to control the $I_1/(I_1+I_2)$ value to provide thermoelectric materials with a high ZT value as described above. It should be noted that the $I_1/(I_1+I_2)$ value can also be controlled by the afore-mentioned melting method or formulation of raw materials besides the heat treatment.

It is preferable that, in view of inhibiting the alloy from oxidizing, the processes such as melting, melt quenching, mechanical alloying and heat treatment be carried out in an inert gas atmosphere of, for instance, Ar.

Then, the alloy is pulverized with a ball mill, Brown mill or stamp mill to prepare alloy powder, followed by molding the alloy powder by sintering, hot pressing or an SPS method. It is preferable that, in view of inhibiting the alloy from oxidizing, the molding be carried out in an inert gas atmosphere of, for instance, Ar. Since the molding is normally carried out by heating the alloy powder, the $I_1/(I_1+I_2)$ value can be controlled by adjusting the heating temperature and the heating time.

Further, the molded product is processed into a desired size. The shape and the dimension of the processed product can be appropriately selected. For instance, a cylinder having an outer diameter in a range of 0.5 to 10 mm and a thickness in a range of 1 to 30 mm, or a rectangular parallelepiped having a plane in a range of 0.5 to 10 mm square and a thickness in a range of 1 to 30 mm can be formed.

A thermoelectric device according to an embodiment of the present invention can be fabricated using the thermoelectric materials prepared by the above method. In this case, the thermoelectric device can be fabricated using either one of an n-type or a p-type thermoelectric chip according to an embodiment the present invention or both conductivity types thereof. When the thermoelectric device is fabricated using either one of an n-type or a p-type thermoelectric chip according to an embodiment the present invention, a Bi—Te-based or Pb—Te-based material is used as the other conductivity type.

FIG. 1 shows a sectional view of an example of a thermoelectric device according to an embodiment of the present invention is shown. In FIG. 1, reference numerals 1 and 2 denote a p-type thermoelectric chip and an n-type thermoelectric chip, respectively. The p-type thermoelectric chip 1 and the n-type thermoelectric chip 2 are connected on the bottom surfaces thereof by the electrode 3a supported by the lower insulating substrate 4a. On the top surfaces of the p-type thermoelectric chip 1 and the n-type thermoelectric chip 2, electrodes 3b and 3b are formed respectively, and further the upper insulating substrate 4b is disposed on the electrodes 3b and 3b.

The principle of the thermoelectric device will be explained. The lower insulating substrate 4a is set to a higher temperature and the upper insulating substrate 4b is set to a lower temperature to provide a temperature difference between the two substrates. In the p-type thermoelectric chip 1, holes 5 having a positive charge move toward the lower temperature side, i.e., the upper side. In the n-type thermoelectric chip 2, electrons 6 having a negative charge move toward the lower temperature side, i.e., the upper side. As a result, a potential difference is generated between the electrode 3b on the top of the p-type thermoelectric chip 1 and the electrode 3b on the top of the n-type thermoelectric chip 2.

Figure 2:
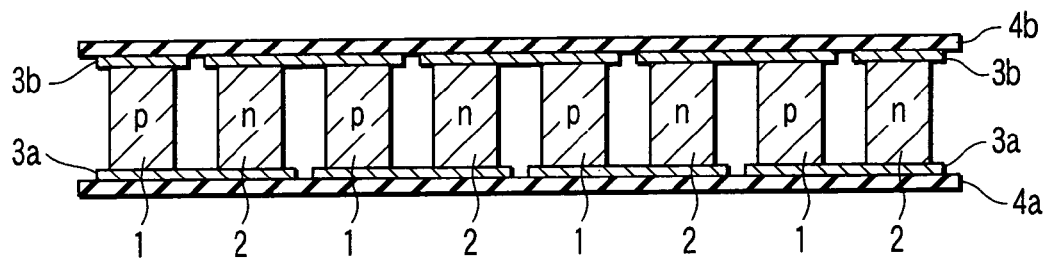
FIG. 2 is a sectional view of a thermoelectric device according to another embodiment of the present invention.

FIG. 2 shows a sectional view of a thermoelectric device according to another embodiment of the present invention. The thermoelectric device has a structure in that a plurality of p-type thermoelectric chips 1 and n-type thermoelectric chips 2 are alternately arranged and these chips are connected in series with the electrodes 3a on the lower insulating substrate 4a and the electrodes 3b on the upper insulating substrate 4b. The thermoelectric device with the structure shown in FIG. 2 can generate a potential difference higher than that with the structure shown in FIG. 1, and can ensure higher electric power.

EXAMPLES

Examples 1 to 6, and Comparative Examples 1 and 2

Raw materials of Ti, Zr, Hf, Ni, Sn and Sb were weighed to provide an alloy having a composition represented by:

$(Ti_{0.30}Zr_{0.35}Hf_{0.35})_{34}Ni_{33}(Sn_{0.994}Sb_{0.006})_{33}$ followed by subjecting to arc melting to prepare the alloy. Then, the resultant alloy was annealed in vacuum for two hour at any temperature in the range of 950 to 1250° C. shown in Table 1.

Each alloy was pulverized in a mortar to a size of 45 μm or less, followed by hot-pressing at 900° C. for one hour, to produce a molded product having an outer diameter of 15 mm and a thickness of 3 mm. A sample having a given shape was cut out from each molded product, which was tested for thermoelectric characteristics. The residue thereof was tested for crystal phases by powder X-ray diffractometry.

Figure 3:
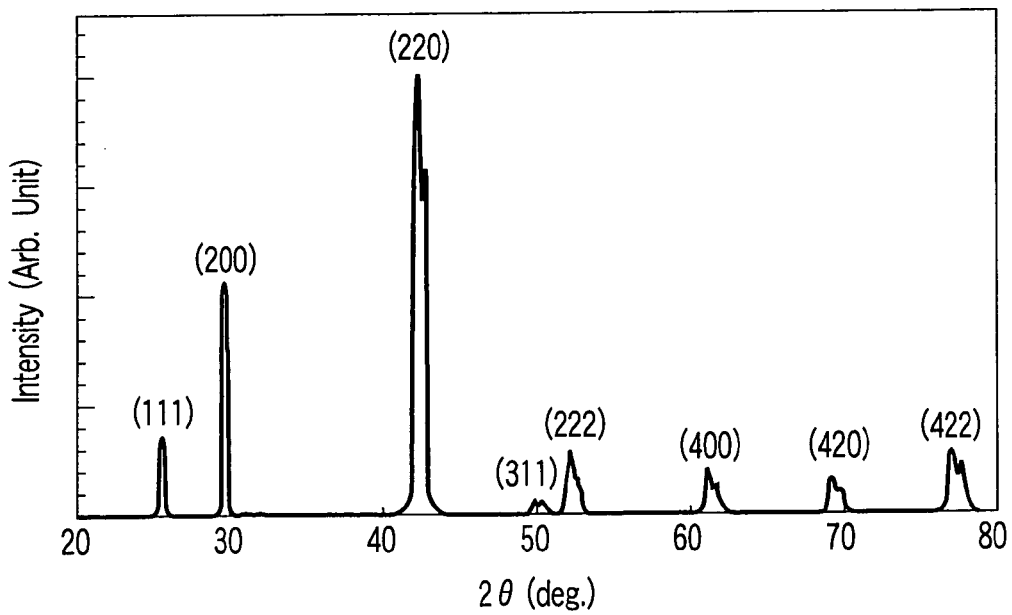
FIG. 3 is a diagram showing a powder X-ray diffraction pattern of the thermoelectric material according to Example 4.

FIG. 3 shows a typical example of an X-ray diffraction pattern with CuKα line, which was measured for the sample of Example 4 annealed at 1150° C. As shown in FIG. 3, it was observed that all diffraction peaks assigned to the MgAgAs crystal phase were split into two peaks and thus there were two types of the MgAgAs crystal phases. The lattice constant calculated from peaks of a lower angle was 6.075 Å and that calculated from peaks of a higher angle was 6.028 Å. The diffraction peaks observed neat the diffraction angle 2θ of 77 to 78° were assigned to diffractions from the (422) plane of the MgAgAs crystal phase. Assuming that the diffraction peak intensity on the higher angle (2θ=77.5°) was $I_1$ and that on the lower angle (2θ=76.9°) was $I_2$, the $I_1/(I_1+I_2)$ value was 0.44.

Next, the characteristics of the respective samples were measured as follows. The thermal diffusivity was measured by a laser flash method. The density was measured by the Archimedes method. The specific heat was measured by differential scanning calorimetry (DSC). The thermal conductivity κ was calculated from these results. The Seebeck coefficient α was measured using a filament sample cut out from each molded product. The electrical resistivity ρ was measured by a four-probe method using each filament sample.

Table 1 shows α, ρ and κ, which were the values at 700 K, and figure of merit ZT ($Z=\alpha^2 T/\rho \kappa$) calculated from these values for each sample. Table 1 also shows the annealing temperature and the $I_1/(I_1+I_2)$ value for each sample.

be obtained. Furthermore, when the annealing is carried out at 1000° C. or more and less than 1180° C. (Examples 3 to 5), the $I_1/(I_1+I_2)$ values fall in a range of 0.3 to 0.6, and further higher ZT values of approximately 1.5 can be obtained.

On the other hand, when the annealing is carried out at 950° C. (Comparative example 1), the $I_1/(I_1+I_2)$ value becomes lower than 0.2, and when the annealing is carried out at 1250° C. (Comparative example 2), the $I_1/(I_1+I_2)$ value exceeds 0.8. As a result, in the comparative examples, the ZT values fall in a range of 0.9 to 1.1, and a higher ZT value exceeding 1.3 can not be obtained.

Examples 7 to 12, and Comparative Examples 3 to 6

Alloys having various compositions shown in Table 2 were prepared by the methods similar to those employed in Examples 1 to 6. Like Example 2, annealing at 1050° C., pulverizing and hot pressing were performed to produce molded products.

X-ray diffraction measurements revealed that all the molded products had at least two MgAgAs crystal phased having different lattice constants.

The Seebeck coefficient, electric resistivity and thermal conductivity were measured for each sample by the methods described above for Examples 1 to 6, and the figure of merit ZT was calculated from these values for each sample. Table 2 shows values of the figure of merit ZT at 700 K. Table 2 also shows the $I_1/(I_1+I_2)$ values.

TABLE 1

|  | Annealing temperature (° C.) | $I_1/(I_1+I_2)$ | α (μV/K) | ρ (mΩ cm) | κ (W/mK) | Figure of merit ZT (700 K) |
|---|---|---|---|---|---|---|
| Example 1 | 1000 | 0.21 | −262 | 1.25 | 2.7 | 1.42 |
| Example 2 | 1050 | 0.24 | −260 | 1.22 | 2.8 | 1.38 |
| Example 3 | 1100 | 0.30 | −274 | 1.25 | 2.8 | 1.50 |
| Example 4 | 1150 | 0.44 | −275 | 1.25 | 2.8 | 1.51 |
| Example 5 | 1175 | 0.59 | −275 | 1.23 | 2.9 | 1.51 |
| Example 6 | 1190 | 0.72 | −271 | 1.21 | 3.1 | 1.37 |
| Comparative Example 1 | 950 | 0.18 | −210 | 1.21 | 2.7 | 0.94 |
| Comparative Example 2 | 1250 | 0.81 | −235 | 1.20 | 3.2 | 1.07 |

As can be seen from Table 1, the $I_1/(I_1+I_2)$ value of the thermoelectric material can be controlled by the annealing temperature. When the annealing is carried out at 1000° C. or more and less than 1200° C. (Examples 1 to 6), the $I_1/(I_1+I_2)$ values fall in a range of 0.2 to 0.8, and higher ZT values can

TABLE 2

|  | Composition | $I_1/(I_1+I_2)$ | Figure of merit ZT (700 K) |
|---|---|---|---|
| Example 7 | $(Er_{0.05}(Ti_{0.38}Zr_{0.32}Hf_{0.30})_{0.95})_{33}Ni_{34}(Sn_{0.997}Sb_{0.003})_{33}$ | 0.35 | 1.47 |
| Example 8 | $(Ti_{0.32}Zr_{0.30}Hf_{0.30}Ta_{0.08})_{34}Ni_{34}Sn_{32}$ | 0.32 | 1.45 |
| Example 9 | $(Ti_{0.36}Zr_{0.30}Hf_{0.30}Nb_{0.04})_{32}Ni_{33}Sn_{35}$ | 0.35 | 1.43 |
| Example 10 | $(Ti_{0.45}Zr_{0.25}Hf_{0.30})_{35}(Ni_{0.996}Co_{0.004})_{34}(Sn_{0.988}Sb_{0.012})_{31}$ | 0.35 | 1.43 |
| Example 11 | $(Ti_{0.35}Zr_{0.35}Hf_{0.30})_{33}(Ni_{0.998}Cu_{0.002})_{35}(Sn_{0.988}Sb_{0.012})_{32}$ | 0.48 | 1.44 |
| Example 12 | $(Ti_{0.35}Zr_{0.35}Hf_{0.30})_{35}Ni_{35}(Sn_{0.990}Sb_{0.008}Si_{0.002})_{30}$ | 0.28 | 1.46 |
| Comparative Example 3 | $(Ti_{0.30}Zr_{0.35}Hf_{0.35})_{29}Ni_{33}(Sn_{0.994}Sb_{0.006})_{38}$ | 0.28 | 1.12 |
| Comparative Example 4 | $(Ti_{0.30}Zr_{0.35}Hf_{0.35})_{35}Ni_{36}(Sn_{0.994}Sb_{0.006})_{29}$ | 0.25 | 1.13 |
| Comparative Example 5 | $(Gd_{0.32}(Ti_{0.38}Zr_{0.32}Hf_{0.30})_{0.68})_{33}Ni_{34}(Sn_{0.997}Sb_{0.003})_{33}$ | 0.27 | 0.85 |
| Comparative Example 6 | $(Zr_{0.50}Hf_{0.50})_{33}Ni_{34}(Sn_{0.997}Sb_{0.003})_{33}$ | — | 0.81 |

As can be seen from Table 2, samples of Examples 7 to 12 exhibit the ZT values slightly higher than that of the sample of Example 2. It is conceivable that this shows the substitution effect of various types of elements.

On the other hand, Comparative examples 3 to 5, the composition ranges of which are deviated from the range defined in the present invention, cannot provide high ZT values, although the $I_1/(I_1+I_2)$ values are within the range defined in the present invention. Furthermore, since Comparative example 6 not only deviates from the composition range defined in the present invention but also is constituted of a single MgAgAs crystal phase alone and does not contain two or more MgAgAs crystal phases that are different in the lattice constant as defined in the present invention, a high ZT value cannot be obtained.

Additional advantages and modifications will readily occur to those skilled in the art. Therefore, the present invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A thermoelectric material comprising a composition represented by the following formula (A):

$$(Ti_{a1}Zr_{b1}Hf_{c1})Ni_ySn_{100-x-y} \quad (A)$$

wherein $0<a1<1$, $0<b1<1$, $0<c1<1$, $a1+b1+c1=1$, $30\leq x\leq 35$, and $30\leq y=35$,
wherein the composition has at least two MgAgAs crystal phases different in a lattice constant, and,
assuming that X-ray diffraction peak intensity from (422) diffraction plane of a first MgAgAs crystal phase having a smallest lattice constant and X-ray diffraction peak intensity from a (422) diffraction plane of a second MgAgAs crystal phase having a largest lattice constant be $I_1$ and $I_2$, respectively, a value of $I_1/(I_1+I_2)$ being in a range of 0.2 to 0.8.

2. The thermoelectric material according to claim 1, wherein the value of $I_1/(I_1+I_2)$ is in a range of 0.3 to 0.6.

3. The thermoelectric material according to claim 1, wherein a part of Ti, Zr and Hf in the formula (A) is substituted by at least one element selected from the group consisting of V, Nb, Ta, Cr, Mo and W.

4. The thermoelectric material according to claim 1, wherein a part of Ni in the formula (A) is substituted by at least one element selected from the group consisting of Mn, Fe, Co and Cu.

5. The thermoelectric material according to claim 1, wherein a part of Sn in the formula (A) is substituted by at least one element selected from the group consisting of Si, Mg, As, Sb, Bi, Ge, Pb, Ga and In.

6. The thermoelectric material according to claim 1, wherein the composition has been subjected to heat treatment under a temperature range of 1000° C. or more and less than 1200° C.

7. The thermoelectric material according to claim 6, wherein the composition has been subjected to heat treatment under a temperature range of 1100° C. or more and less than 1180° C.

8. The thermoelectric material according to claim 6, wherein the composition has been subjected to heat treatment in hot pressing.

9. A thermoelectric material comprising a composition represented by the following formula (B):

$$(Ln_d(Ti_{a2}Zr_{b2}Hf_{c2})_{1-d})_xNi_ySn_{100-x-y} \quad (B)$$

where Ln is at least one element selected from the group consisting of Y and rare earth elements, and $0<a2<1$, $0<b2<1$, $0<c2<1$, $a2+b2+c2=1$, $30\leq x\leq 35$, and $30\leq y\leq 35$,
wherein the composition has at least two MgAgAs crystal phases different in a lattice constant, and,
assuming that X-ray diffraction peak intensity from a (422) diffraction plane of a first MgAgAs crystal phase having a smallest lattice constant and X-ray diffraction peak intensity from a (422) diffraction plane of a second MgAgAs crystal phase having a largest lattice constant be $I_1$ and $I_2$, respectively, a value of $I_1/(I_1+I_2)$ being in a range of 0.2 to 0.8.

10. The thermoelectric material according to claim 9, wherein the value of $I_1/(I_1+I_2)$ is in a range of 0.3 to 0.6.

11. The thermoelectric material according to claim 9, wherein a part of Ti, Zr and Hf in the formula (B) is substituted by at least one element selected from the group consisting of V, Nb, Ta, Cr, Mo and W.

12. The thermoelectric material according to claim 9, wherein a part of Ni in the formula (B) is substituted by at least one element selected from the group consisting of Mn, Fe, Co and Cu.

13. The thermoelectric material according to claim 9, wherein a part of Sn in the formula (B) is substituted by at least one element selected from the group consisting of Si, Mg, As, Sb, Bi, Ge, Pb, Ga and In.

14. The thermoelectric material according to claim 9, wherein the composition has been subjected to heat treatment under a temperature range of 1000° C. or more and less than 1200° C.

15. The thermoelectric material according to claim 14, wherein the composition has been subjected to heat treatment under a temperature range of 1100° C. or more and less than 1180° C.

16. The thermoelectric material according to claim 14, wherein the composition has been subjected to heat treatment in hot pressing.

17. A thermoelectric device comprising p-type thermoelectric chips and n-type thermoelectric chips connected alternately in series, and at least the p-type thermoelectric chips or the n-type thermoelectric chips comprising the thermoelectric material according to claim 1.

18. A thermoelectric device comprising p-type thermoelectric chips and n-type thermoelectric chips connected alternately in series, and at least the p-type thermoelectric chips or the n-type thermoelectric chips comprising the thermoelectric material according to claim 9.

19. A thermoelectric material comprising a composition represented by the following formula (A):

$$(Ti_{a1}Zr_{b1}Hf_{c1})Ni_ySn_{100-x-y} \quad (A)$$

wherein $0<a1<1$, $0<b1<1$, $0<c1<1$, $a1+b1+c1=1$, $30\leq x\leq 35$, and $30\leq y\leq 35$,
wherein the composition has at least two MgAgAs crystal phases different in a lattice constant, and
wherein assuming that an X-ray diffraction peak intensity from a (422) diffraction plane of a first MgAgAs crystal phase having a smallest lattice constant and an X-ray diffraction peak intensity from a (422) diffraction plane of a second MgAgAs crystal phase having a largest lattice constant are $I_1$ and $I_2$, respectively, then the thermoelectric material has a value of $I_1/(I_1+I_2)$ in a range of 0.2 to 0.8 and a ZT value of higher than 1.3, wherein $Z=\alpha^2/(\rho\kappa)$ where $\alpha$ is a Seebeck coefficient of thermoelectric material, $\rho$ is an electrical resistivity of the thermoelectric material, κ is a thermal conductivity of the thermoelectric material, and T is an absolute temperature.

20. A thermoelectric material comprising a composition represented by the following formula (B):

$$(Ln_d(Ti_{a2}Zr_{b2}Hf_{c2})_{1-d})_x Ni_y Sn_{100-x-y} \quad (B)$$

wherein Ln is at least one element selected from the group consisting of Y and rare earth elements, and $0<a2<1$, $0<b2<1$, $0<c2<1$, $a2+b2+c2=1$, $30 \leq x \leq 35$, and $30 \leq y \leq 35$, wherein the composition has at least two MgAgAs crystal phases different in a lattice constant, and wherein assuming that an X-ray diffraction peak intensity from a (422) diffraction plane of a first MgAgAs crystal phase having a smallest lattice constant and an X-ray diffraction peak intensity from a (422) diffraction plane of a second MgAgAs crystal phase having a largest lattice constant are $I_1$ and $I_2$, respectively, then the thermoelectric material has a value of $I_1/(I_1+I_2)$ in a range of 0.2 to 0.8 and a ZT value of higher than 1.3, wherein $Z=\alpha^2/(\rho\kappa)$ where $\alpha$ is a Seebeck coefficient of thermoelectric material, $\rho$ is an electrical resistivity of the thermoelectric material, κ is a thermal conductivity of the thermoelectric material, and T is an absolute temperature.

* * * * *